(12) United States Patent
Morita et al.

(10) Patent No.: US 10,707,109 B2
(45) Date of Patent: Jul. 7, 2020

(54) SUBSTRATE PROCESSING APPARATUS

(71) Applicant: Tokyo Electron Limited, Tokyo (JP)

(72) Inventors: Satoshi Morita, Kumamoto (JP); Ryoji Ikebe, Kumamoto (JP); Yasuaki Noda, Kumamoto (JP); Norihisa Koga, Kumamoto (JP); Keisuke Hamamoto, Kumamoto (JP); Masato Hosaka, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 53 days.

(21) Appl. No.: 16/137,728

(22) Filed: Sep. 21, 2018

(65) Prior Publication Data
US 2019/0096730 A1 Mar. 28, 2019

(30) Foreign Application Priority Data
Sep. 25, 2017 (JP) .................................. 2017-183585

(51) Int. Cl.
*H01L 21/67* (2006.01)
*H01L 21/68* (2006.01)
*B65G 21/10* (2006.01)
*H01L 23/544* (2006.01)
(Continued)

(52) U.S. Cl.
CPC ............ *H01L 21/681* (2013.01); *B65G 21/10* (2013.01); *G06T 7/0004* (2013.01); *H01L 21/6708* (2013.01); *H01L 21/67028* (2013.01); *H01L 23/544* (2013.01); *B65G 2203/041* (2013.01);
(Continued)

(58) Field of Classification Search
CPC ........ H01L 21/67; H01L 21/68; H01L 21/681; H01L 21/67028; H01L 23/544; B65G 21/10
USPC ........ 198/341.05, 346.1, 346.2, 502.2, 502.3; 414/403, 419
See application file for complete search history.

(56) References Cited

U.S. PATENT DOCUMENTS 6,847,730 B1 * 1/2005 Beer ..................... H01L 21/681
348/125
7,650,691 B2 * 1/2010 Narita ............... H01L 21/67132
29/740
(Continued)

FOREIGN PATENT DOCUMENTS

JP 2016-100565 A 5/2016

*Primary Examiner* — Douglas A Hess
(74) *Attorney, Agent, or Firm* — Abelman, Frayne & Schwab

(57) ABSTRACT

A substrate processing apparatus includes carry in/out station, transfer station, processing station, and image capturing unit. The carry in/out station includes first conveyance device that takes out and conveys substrate from cassette. The transfer station is disposed adjacent to the carry in/out station, and includes substrate placement unit on which the substrate conveyed by the first conveyance device is placed. The processing station is disposed adjacent to the transfer station, and includes second conveyance device that takes out and conveys the substrate from the substrate placement unit, and a plurality of processing units that processes the substrate conveyed by the second conveyance device. The image capturing unit is disposed in the transfer station, and captures an image of the peripheral edge portion of one of the upper and lower surfaces of the substrate and the end surface of the substrate.

13 Claims, 14 Drawing Sheets

(51) Int. Cl.
  *G06T 7/00* (2017.01)
  *H01L 21/687* (2006.01)
(52) U.S. Cl.
  CPC ............... *G06T 2207/30148* (2013.01); *H01L 21/68728* (2013.01); *H01L 2223/54493* (2013.01)

(56) References Cited

U.S. PATENT DOCUMENTS

| | | | | |
|---|---|---|---|---|
| 7,788,197 | B2* | 8/2010 | Tooyama | H01L 21/67757 |
| | | | | 700/121 |
| 8,215,473 | B2* | 7/2012 | Baccini | H01L 21/67715 |
| | | | | 198/346.2 |
| 8,707,893 | B2* | 4/2014 | Deguchi | H01L 21/6708 |
| | | | | 118/300 |
| 8,854,614 | B2* | 10/2014 | Kang | H01L 21/67115 |
| | | | | 356/237.4 |
| 9,346,625 | B2* | 5/2016 | Suzuki | B65G 43/10 |
| 9,404,180 | B2* | 8/2016 | Hara | C23C 16/16 |
| 9,404,184 | B2* | 8/2016 | Aikawa | C23C 16/44 |
| 9,508,573 | B2* | 11/2016 | Kashiyama | H01L 21/6715 |
| 9,799,542 | B2* | 10/2017 | Sugawara | H01L 21/67346 |
| 9,886,029 | B2* | 2/2018 | Kurahashi | H01L 21/68 |
| 10,112,205 | B2* | 10/2018 | Inagaki | B05B 9/03 |
| 10,143,089 | B2* | 11/2018 | Brosi | B41F 15/18 |
| 10,381,221 | B2* | 8/2019 | Noda | H01L 21/67253 |
| 10,438,920 | B2* | 10/2019 | Otsuka | H01L 21/6838 |
| 2016/0148366 | A1* | 5/2016 | Amano et al. | |
| 2017/0133253 | A1* | 5/2017 | Fischer et al. | |
| 2017/0278728 | A1* | 9/2017 | Amano et al. | |

* cited by examiner

SUBSTRATE PROCESSING APPARATUS

CROSS-REFERENCE TO RELATED APPLICATIONS

This application is based on and claims priority from Japanese Patent Application No. 2017-183585, filed on Sep. 25, 2017, with the Japan Patent Office, the disclosure of which is incorporated herein in its entirety by reference.

TECHNICAL FIELD

The present disclosure relates to a substrate processing apparatus.

BACKGROUND

In the related art, a substrate processing apparatus has been known which performs a processing of removing a film from a peripheral edge portion of a substrate such as, for example, a silicon wafer or a compound semiconductor wafer, by supplying a chemical liquid to the peripheral edge portion of the substrate (hereinafter, referred to as a "peripheral edge portion removal processing").

In this type of substrate processing apparatus, in order to confirm whether the film of the peripheral edge portion of the substrate has been appropriately removed, a camera may be provided inside a chamber where the peripheral edge portion removal processing is performed, for capturing an image of the peripheral edge portion of the substrate.

For example, Japanese Patent Laid-Open Publication No. 2016-100565 describes fixedly providing an image capturing unit that captures an image of the peripheral edge portion of the substrate, relative to the chamber. Further, Japanese Patent Laid-Open Publication No. 2016-100565 describes providing a camera relative to a measurement jig which is attachable to and detachable from the chamber.

SUMMARY

According to an aspect of an embodiment, a substrate processing apparatus includes a carry in/out station, a transfer station, a processing station, and an image capturing unit. The carry in/out station includes a first conveyance device that takes out and conveys a substrate from a cassette. The transfer station is disposed adjacent to the carry in/out station, and includes a substrate placement unit on which the substrate conveyed by the first conveyance device is placed. The processing station is disposed adjacent to the transfer station, and includes a second conveyance device that takes out and conveys the substrate from the substrate placement unit, and a plurality of processing units that processes the substrate conveyed by the second conveyance device. The image capturing unit is disposed in the transfer station, and captures an image of a peripheral edge portion of one of the upper and lower surfaces of the substrate and the end surface of the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
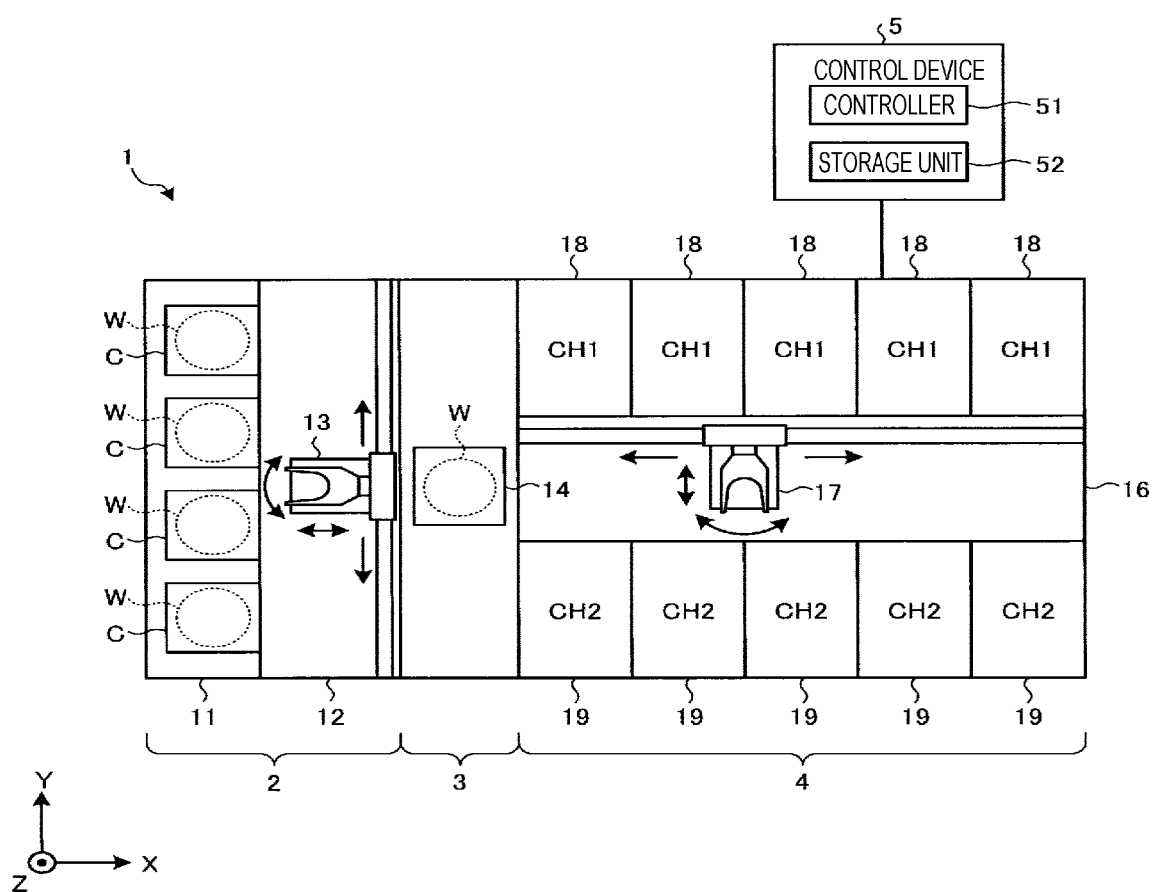
FIG. 1 is a schematic plan view of a substrate processing system according to an embodiment of the present disclosure.

In the following detailed description, reference is made to the accompanying drawings, which form a part of the present disclosure. The illustrative embodiments described in the detailed description, drawing, and claims are not meant to be in any way limiting. Other embodiments may be utilized, and other changes may be made without departing from the spirit or the scope of the subject matter presented here.

When an image capturing unit is provided inside the chamber, the apparatus may become bigger in size.

An aspect of an embodiment is to provide a substrate processing apparatus in which the state of the peripheral edge portion of the substrate may be confirmed while suppressing the size of the apparatus from being increased.

According to an aspect of an embodiment, a substrate processing apparatus includes a carry in/out station, a transfer station, a processing station, and an image capturing unit. The carry in/out station includes a first conveyance device that takes out and conveys a substrate from a cassette. The transfer station is disposed adjacent to the carry in/out station, and includes a substrate placement unit on which the substrate conveyed by the first conveyance device is placed. The processing station is disposed adjacent to the transfer station, and includes a second conveyance device that takes out and conveys the substrate from the substrate placement unit, and a plurality of processing units that processes the substrate conveyed by the second conveyance device. The image capturing unit is disposed in the transfer station, and captures an image of a peripheral edge portion of one of upper and lower surfaces of the substrate and an end surface of the substrate.

In the substrate processing apparatus described above, the image capturing unit is disposed below the substrate placement unit.

In the substrate processing apparatus described above, the image capturing unit has an opening that opens toward a conveyance section where the second conveyance device is accommodated, and the second conveyance device carries the substrate into or out from the image capturing unit via the opening.

In the substrate processing apparatus described above, the image capturing unit includes a mirror member that reflects light reflected from the end surface of the substrate, and a one-surface side image capturing unit that receives each of light reflected from the peripheral edge portion of one-surface of the substrate and the light reflected from the mirror member, so as to capture an image of the peripheral edge portion of the one surface of the substrate and the end surface of the substrate at the same time.

In the substrate processing apparatus described above, the image capturing unit includes an opposite surface side image capturing unit that captures an image of a peripheral edge portion of an opposite one of the upper and lower surfaces of the substrate.

The substrate processing apparatus described above further includes an adjustment mechanism that adjusts a rotational position of the substrate with respect to an image capturing range of the image capturing unit.

In the substrate processing apparatus described above, the adjustment mechanism includes a rotation holding unit that adsorbs, holds, and rotates the substrate, and a detection unit that detects a notch formed in the substrate, and while adsorbing, holding, and rotating the substrate by using the rotation holding unit, the image capturing unit detects the notch by using the detection unit and adjusts the rotational position of the substrate based on a detection result.

In the substrate processing apparatus described above, after the adjustment of the rotational position of the substrate, the image capturing unit captures an image of the peripheral edge portion of one surface of the substrate and the end surface of the substrate over the entire circumference of the substrate while rotating the substrate by using the rotation holding unit.

According to an aspect of an embodiment, the state of the peripheral edge portion of the substrate may be confirmed while suppressing the increase in size of the apparatus.

<Configuration of Substrate Processing System>

Figure 2:
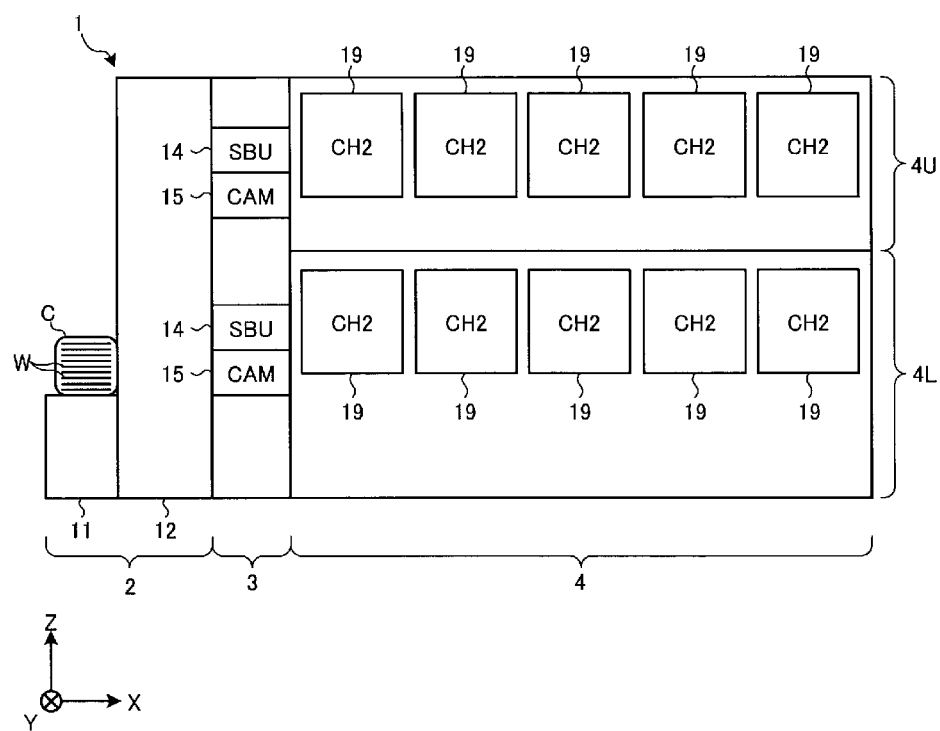
FIG. 2 is a schematic side view of the substrate processing system according to the embodiment.

First, the configuration of the substrate processing system according to the present embodiment will be described with reference to FIGS. 1 and 2. FIG. 1 is a schematic plan view of the substrate processing system according to the present embodiment. FIG. 2 is a schematic side view of the substrate processing system according to the present embodiment. Hereinafter, in order to clarify the positional relationship, the X-axis, the Y-axis, and the Z-axis which are orthogonal to each other are defined, and the positive Z-axis direction is regarded as a vertically upward direction.

As illustrated in FIG. 1, a substrate processing system 1 according to the present embodiment includes a carry-in/out station 2, a transfer station 3, and a processing station 4. The carry-in/out station 2, the transfer station 3, and the processing station 4 are arranged side by side in this order.

In the substrate processing system 1, a substrate carried from the carry in/out station 2, that is, a semiconductor wafer (hereinafter, "wafer W") in the present embodiment is conveyed to the processing station 4 via the transfer station 3, and processed in the processing station 4. Further, in the substrate processing system 1, the processed wafer W is returned to the carry in/out station 2 from the processing station 4 via the transfer station 3, and taken from the carry in/out station 2 to the outside.

The carry-in/out station 2 includes a cassette placement section 11 and a conveyance section 12. In the cassette placement section 11, a plurality of cassettes C is placed to each accommodate a plurality of wafers W horizontally.

The conveyance section 12 is disposed between the cassette placement section 11 and the transfer station 3, and includes a first conveyance device 13 therein. The first conveyance device 13 includes a plurality of (five in the present embodiment) wafer holders each holding a single wafer W. The first conveyance device 13 is movable horizontally and vertically, and pivotable about a vertical axis. The first conveyance device 13 may convey the plurality of wafers W at the same time between a cassette C and the transfer station 3 by using the plurality of wafer holders.

Next, the transfer station 3 will be described. As illustrated in FIGS. 1 and 2, a plurality of substrate placement units (SBUs) 14 and a plurality of image capturing units (CAMs) 15 are arranged inside the transfer station 3. Specifically, the processing station 4 to be described later includes a first processing station 4U at the upper stage and a second processing station 4L at the lower stage, and each substrate placement unit 14 and each image capturing unit 15 are disposed at each of the positions corresponding to the first and second processing stations 4U and 4L, respectively. The configuration of the substrate placement unit 14 and the image capturing unit 15 will be described later.

Next, the processing station 4 will be described. As illustrated in FIG. 2, the processing station 4 includes the first and second processing stations 4U and 4L. The first and second processing stations 4U and 4L are spatially partitioned by, for example, a partition wall or a shutter, and arranged side by side in the height direction.

The first and second processing stations 4U and 4L have the same configuration from each other, and includes a conveyance section 16, a second conveyance device 17, a plurality of peripheral edge portion processing units CH1 18, and a plurality of lower surface processing units CH2 19, as illustrated in FIG. 1.

The second conveyance device 17 is disposed inside the conveyance section 16, and conveys the wafer W among the substrate placement unit 14, the image capturing unit 15, the peripheral edge portion processing units 18, and the lower surface processing units 19.

The second conveyance device 17 includes one wafer holder that holds a single wafer W. The second conveyance device 17 is movable horizontally and vertically, and pivotable about a vertical axis. The second conveyance device 17 conveys a single wafer W by using the wafer holder.

The plurality of peripheral edge portion processing units 18 and the plurality of lower surface processing units 19 are arranged adjacent to the conveyance section 16. As an example, the plurality of peripheral edge portion processing units 18 are arranged side by side along the X-axis direction on the side of the conveyance section 16 in the positive Y-axis direction, and the plurality of lower surface processing units 19 are arranged side by side along the X-axis direction on the side of the conveyance section 16 in the negative Y-axis direction.

Each of the plurality of peripheral edge portion processing units 18 performs a predetermined processing on the peripheral edge portion of the wafer W. In the present embodiment, the peripheral edge portion processing unit 18 performs a bevel removal processing for etching and removing a film from the bevel portion of the wafer W (an example of a peripheral edge portion processing). The bevel portion refers to the end surface of the wafer W and the slope portion formed around the end surface. The slope portion is formed on each of the upper surface peripheral edge portion and the lower surface peripheral edge portion of the wafer W.

Figure 3:
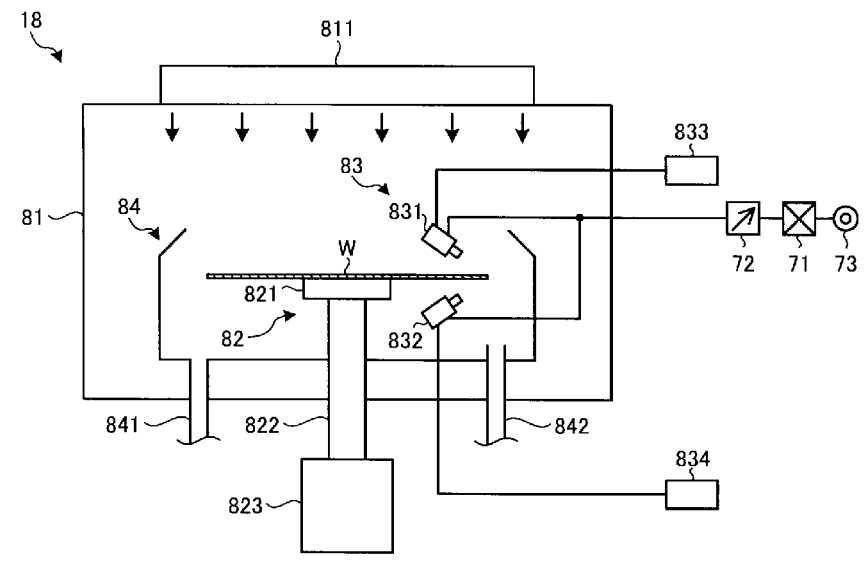
FIG. 3 is a schematic view of a peripheral edge portion processing unit.

An example of the configuration of the peripheral edge portion processing unit 18 will be described with reference to FIG. 3. FIG. 3 is a schematic view of the peripheral edge portion processing unit 18.

As illustrated in FIG. 3, the peripheral edge portion processing unit 18 includes a chamber 81, a substrate holding mechanism 82, a supply unit 83, and a recovery cup 84.

The chamber 81 accommodates the substrate holding mechanism 82, the supply unit 83, and the recovery cup 84 therein. A fan filter unit (FFU) 811 is provided on the ceiling portion of the chamber 81 to form a down flow inside the chamber 81.

The substrate holding mechanism 82 includes a holding unit 821 that holds the wafer W horizontally, a support column member 822 that extends vertically to support the holding unit 821, and a driving unit 823 that rotates the support column member 822 around the vertical axis.

The holding unit 821 is connected to an adsorption device (not illustrated) such as, for example, a vacuum pump, and holds the wafer W horizontally by adsorbing the lower surface of the wafer W using the negative pressure generated by the adsorption of the adsorption device. As for the holding unit 821, for example, a porous chuck or an electrostatic chuck may be used.

The holding unit 821 has an adsorption region having a smaller diameter than that of the wafer W. Accordingly, a chemical liquid ejected from a lower nozzle 832 of the supply unit 83 to be described later may be supplied to the lower surface peripheral edge portion of the wafer W.

The supply unit 83 includes an upper nozzle 831 and the lower nozzle 832. The upper nozzle 831 is disposed above the wafer W held by the substrate holding mechanism 82, and the lower nozzle 832 is disposed below the same wafer W.

A chemical liquid supply source 73 is connected to the upper and lower nozzles 831 and 832 via a valve 71 and a flow rate regulator 72. The upper nozzle 831 ejects a chemical liquid such as, for example, hydrofluoric acid (HF) or nitric acid ($HNO_3$) supplied from the chemical liquid supply source 73, to the upper surface peripheral edge portion of the wafer W held by the substrate holding mechanism 82. The lower nozzle 832 ejects the chemical liquid supplied from the chemical liquid supply source 73 to the lower surface peripheral edge portion of the wafer W held by the substrate holding mechanism 82.

Further, the supply unit 83 includes a first movement mechanism 833 that moves the upper nozzle 831 and a second movement mechanism 834 that moves the lower nozzle 832. By moving the upper and lower nozzles 831 and 832 using the first and second movement mechanisms 833 and 834, the position of the supply of the chemical liquid to the wafer W may be changed.

The recovery cup 84 is disposed to surround the substrate holding mechanism 82. In the bottom portion of the recovery cup 84, a drain port 841 is formed to discharge the chemical liquid supplied from the supply unit 83 to the outside of the chamber 81, and an exhaust port 842 is formed to exhaust the atmosphere in the chamber 81.

The peripheral edge portion processing unit 18, configured as described above, adsorbs and holds the lower surface of the wafer W on the holding unit 821, and then, rotates the wafer W by using the driving unit 823. Then, the peripheral edge portion processing unit 18 ejects the chemical liquid from the upper nozzle 831 toward the upper surface peripheral edge portion of the rotating wafer W, and simultaneously, ejects the chemical liquid from the lower nozzle 832 toward the lower surface peripheral edge portion of the rotating wafer W. As a result, the film adhering to the bevel portion of the wafer W is removed. At this time, dirt such as, for example, particles adhering to the bevel portion of the wafer W are also removed along with the film.

After performing the peripheral edge portion removal processing as described above, the peripheral edge portion processing unit 18 may perform a rinsing processing for washing off the chemical liquid residual on the bevel portion of the wafer W by ejecting a rinse liquid such as, for example, deionized water from the upper and lower nozzles 831 and 832. In addition, after the rinsing processing, the peripheral edge portion processing unit 18 may perform a drying processing for drying the wafer W by rotating the wafer W.

In addition, here, the peripheral edge portion processing unit 18 performs the bevel removal processing for etching and removing the film from the bevel portion of the wafer W, as an example of the peripheral edge portion processing. However, the peripheral edge portion processing may not be necessarily the processing of removing the film. For example, the peripheral edge portion processing unit 18 may perform a peripheral edge portion cleaning processing for cleaning the bevel portion of the wafer W, as the peripheral edge portion processing.

The lower surface processing unit 19 performs a predetermined processing on the lower surface of the wafer W. In the present embodiment, the lower surface processing unit 19 performs a lower surface removal processing for etching and removing the film from the entire lower surface of the wafer W (an example of the lower surface processing).

Figure 4:
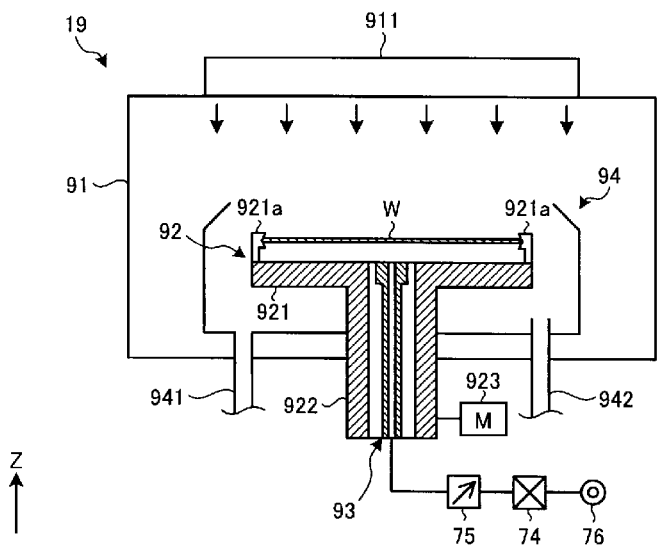
FIG. 4 is a schematic view of a lower surface processing unit.

Here, an example of the configuration of the lower surface processing unit 19 will be described with reference to FIG. 4. FIG. 4 is a schematic view of the lower surface processing unit 19.

As illustrated in FIG. 4, the lower surface processing unit 19 includes a chamber 91, a substrate holding mechanism 92, a supply unit 93, and a recovery cup 94.

The chamber 91 accommodates the substrate holding mechanism 92, the supply unit 93, and the recovery cup 94 therein. An FFU 911 is provided on the ceiling portion of the chamber 91 to form a down flow inside the chamber 91.

The substrate holding mechanism 92 includes a holding unit 921 that holds the wafer W horizontally, a support column member 922 that extends vertically to support the holding unit 921, and a driving unit 923 that rotates the support column member 922 around the vertical axis. A plurality of gripping units 921a is provided on the top surface of the holding unit 921 to grip the peripheral edge portion of the wafer W, and the wafer W is held horizontally by the gripping units 921a in a state of being slightly spaced apart from the top surface of the holding unit 921.

The supply unit 93 is inserted through the hollow portion of the holding unit 921 and the support column member 922. A flow path is formed inside the supply unit 93 to extend vertically. A chemical liquid supply source 76 is connected to the flow path via a valve 74 and a flow rate regulator 75. The supply unit 93 supplies a chemical liquid supplied from the chemical liquid supply source 76, to the lower surface of the wafer W.

The recovery cup 94 is disposed to surround the substrate holding mechanism 92. In the bottom portion of the recovery cup 94, a drain port 941 is formed to discharge the chemical liquid supplied from the supply part 93 to the outside of the chamber 91, and an exhaust port 942 is formed to exhaust the atmosphere in the chamber 91.

The lower surface processing unit 19, configured as described above, holds the peripheral edge portion of the wafer W by the plurality of gripping units 921a of the holding unit 921, and then, rotates the wafer W by using the driving unit 923. Then, the lower surface processing unit 19 ejects the chemical liquid from the supply unit 93 toward the central portion of the lower surface of the rotating wafer W. The chemical liquid supplied to the central portion of the lower surface of the wafer W spreads over the entire lower surface of the wafer W with the rotation of the wafer W. As a result, the film is removed from the entire lower surface of the wafer W. At this time, dirt such as, for example, particles adhering to the lower surface of the wafer W are also removed along with the film.

After performing the lower surface removal processing as described above, the lower surface processing unit 19 may perform a rinsing processing for washing off the chemical liquid residual on the lower surface of the wafer W by ejecting a rinse liquid such as, for example, deionized water from the supply unit 93. In addition, after the rinsing processing, the lower surface processing unit 19 may perform a drying processing for drying the wafer W by rotating the wafer W.

In addition, here, the lower surface processing unit 19 performs the lower surface removal processing of removing the film from the entire lower surface of the wafer W, as an example of the lower surface processing. However, the lower surface processing may not be necessarily the processing of removing the film. For example, the lower surface processing unit 19 may perform a lower surface cleaning processing of cleaning the entire lower surface of the wafer W, as the lower surface processing.

As illustrated in FIG. 1, the substrate processing system 1 includes the control device 5. The control device 5 is, for example, a computer and includes a controller 51 and a storage unit 52. The storage unit 52 stores programs for controlling the various processings that are performed in the substrate processing system 1. The controller 51 is, for example, a central processing unit (CPU), and controls the operation of the substrate processing system 1 by reading and executing the programs stored in the storage unit 52.

In addition, the programs may be recorded in a computer readable recording medium, and installed from the recording medium into the storage unit 52 of the control device 5. The computer readable recording medium may be, for example, a hard disc (HD), a flexible disc (FD), a compact disc (CD), a magnet optical disc (MO), or a memory card. In addition, the controller 51 may be configured by hardware alone without using programs.

Meanwhile, in the peripheral edge portion removal processing, the width of the film to be removed (the width along the radial direction of the wafer W from one end thereof at the peripheral edge of the wafer W; hereinafter, referred to as "cut width") is defined. However, for example, when the positions of the upper and lower nozzles 831 and 832 are not appropriate, the actual cut width may deviate from the defined cut width. Further, when the center of the wafer W deviates from the rotation center of the substrate holding mechanism 82, the cut width in the circumferential direction of the wafer W may be inconsistent. Thus, it may be required to perform a work of image capturing of the wafer W that has been subjected to the peripheral edge portion removal processing with a camera, and confirming whether the peripheral edge portion removal processing has been appropriately performed, based on the obtained image.

In the related art, the camera for capturing an image of the wafer that has been subjected to the peripheral edge portion removal processing is provided inside the chamber of each peripheral edge portion processing unit. However, when the camera is provided inside the chamber of each peripheral edge portion processing unit, the size of the substrate processing system may increase. Further, for example, the chemical liquid may adhere to the camera, and as a result, it may be difficult to appropriately perform the image capturing.

In addition, in the related art, it has been suggested to attach a measurement jig equipped with a camera to the peripheral edge portion processing unit, and capture an image of the wafer that has been subjected to the peripheral edge portion removal processing, after the peripheral edge portion removal processing is performed. However, it takes time to attach and detach the measurement jig. Further, the measurement accuracy may be deteriorated due to an individual difference among the peripheral edge portion processing units.

Thus, in the substrate processing system 1 according to the present embodiment, a single image capturing unit 15 is provided outside the peripheral edge portion processing units 18 to be shared by the plurality of peripheral edge portion processing units 18, to capture an image of the bevel portion of the wafer W that has been subjected to the peripheral edge portion removal processing. Specifically, in the substrate processing system 1, the transfer station 3 is provided therein with a single image capturing unit 15 that corresponds to the plurality of peripheral edge portion processing units 18 arranged in the first processing station 4U and a single image capturing unit 15 that corresponds to the plurality of peripheral edge portion processing units 18 arranged in the second processing station 4L (see, e.g., FIG. 2).

<Configuration of Image Capturing Unit>

Hereinafter, the configuration of the image capturing unit 15 according to the present embodiment will be specifically described with reference to FIGS. 5 to 13.

Figure 5:
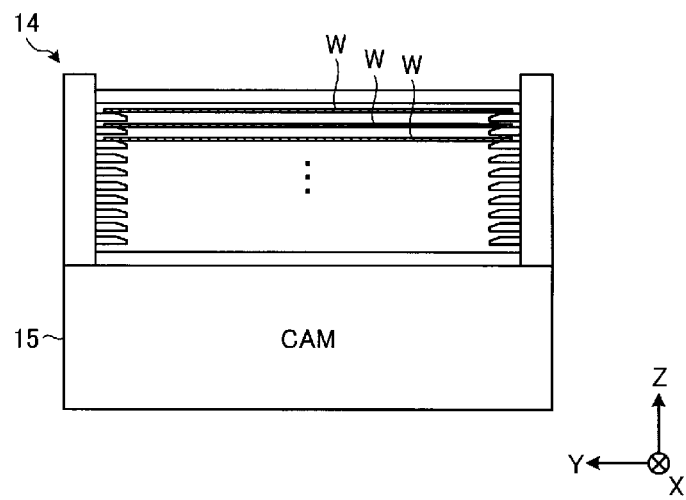
FIG. 5 is a schematic view of a substrate placement unit and an image capturing unit when viewed from the side.

FIG. 5 is a schematic view of the substrate placement unit 14 and the image capturing unit 15 when viewed from the side. As illustrated in FIG. 5, the image capturing unit 15 is provided adjacent to the substrate placement unit 14 below the substrate placement unit 14.

By arranging the substrate placement unit 14 and the image capturing unit 15 to overlap with each other in the height direction, an increase in footprint of the substrate processing system 1 may be suppressed. Further, by disposing the image capturing unit 15 below the substrate placement unit 14, even in a case where, for example, dust falls from the image capturing unit 15, the falling dust may be suppressed from adhering to the wafer W placed on the substrate placement unit 14.

In addition, the image capturing unit 15 may not necessarily be disposed below the substrate placement unit 14, and may be disposed above the substrate placement unit 14.

Figure 6:
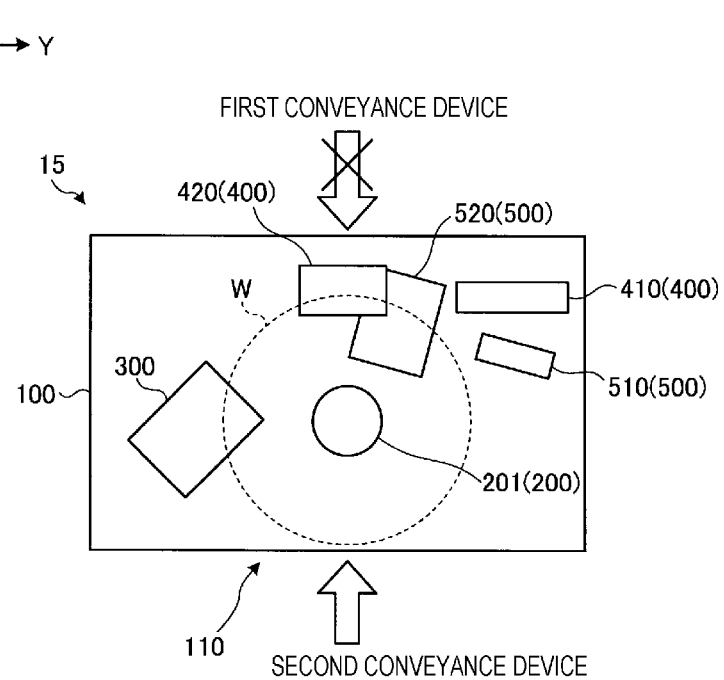
FIG. 6 is a schematic view of the image capturing unit when viewed from above.
Figure 7:
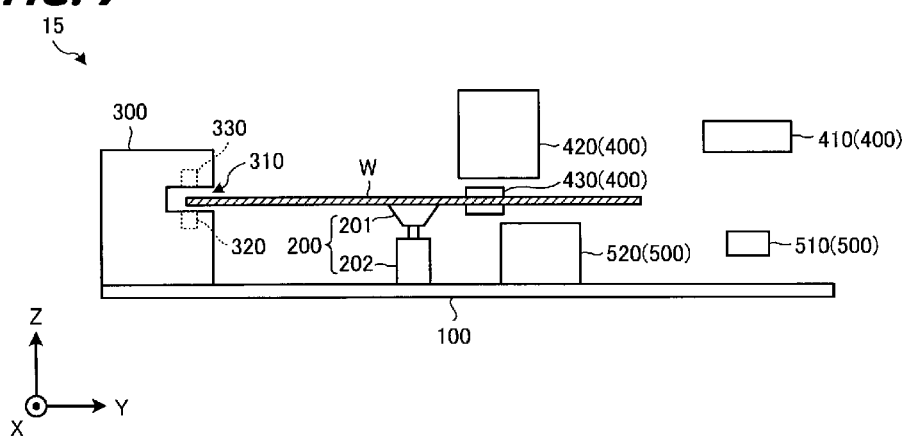
FIG. 7 is a schematic view of the image capturing unit when viewed from the side.

FIG. 6 is a schematic view of the image capturing unit 15 when viewed from above, and FIG. 7 is a schematic view of the image capturing unit 15 when viewed from the side.

As illustrated in FIG. 6, the image capturing unit 15 includes a base plate 100, a rotation holding subunit 200 (an example of the rotation holding unit), a notch detection subunit 300 (an example of the detection unit), and first and second image capturing subunits 400 and 500.

In the substrate processing system 1 according to the present embodiment, of the first and second conveyance devices 13 and 17, only the second conveyance device 17 is configured to access the image capturing unit 15. Specifically, the image capturing unit 15 has an opening 110 that opens toward the conveyance section 16, and the second conveyance device 17 carries the wafer W into or out from the image capturing unit 15 via the opening 110. In addition, a camera 410, a lighting module 420, and a mirror member 430 of the first image capturing subunit 400, and a camera 510 and a lighting module 520 of the second image capturing subunit 500 which will be described later are arranged farther from the opening 110 than a holding table 201, in order not to disturb the carry-in/out of the wafer W by the second conveyance device 17.

The base plate 100 is, for example, a plate-shaped member, and the respective subunits 200 to 500 are provided on the base plate 100.

The rotation holding subunit 200 includes the holding table 201 and an actuator 202. The holding table 201 is, for example, an adsorption chuck that holds the wafer W horizontally by, for example, adsorption. The holding table 201 has an adsorption region having a diameter smaller than that of the wafer W. The actuator 202 is, for example, an electric motor and rotationally drives the holding table 201.

The notch detection subunit 300 includes, for example, a lateral groove 310. A light emitting element 320 is provided on the lower surface of the lateral groove 310, and a light receiving element 330 is provided on the upper surface of the lateral groove 310.

In a state where the wafer W is placed on the rotation holding subunit 200, irradiation light from the light emitting element 320 is blocked by the peripheral edge portion of the wafer W, and is not received in the light receiving element 330. However, when the notch formed in the peripheral edge portion of the wafer W arrives at the position opposite to the light emitting element 320 by the rotation by the rotation holding subunit 200, the irradiation light passes through the notch and is received in the light receiving element 330. As a result, the notch detection subunit 300 may detect the position of the notch formed in the wafer W.

Figure 8:
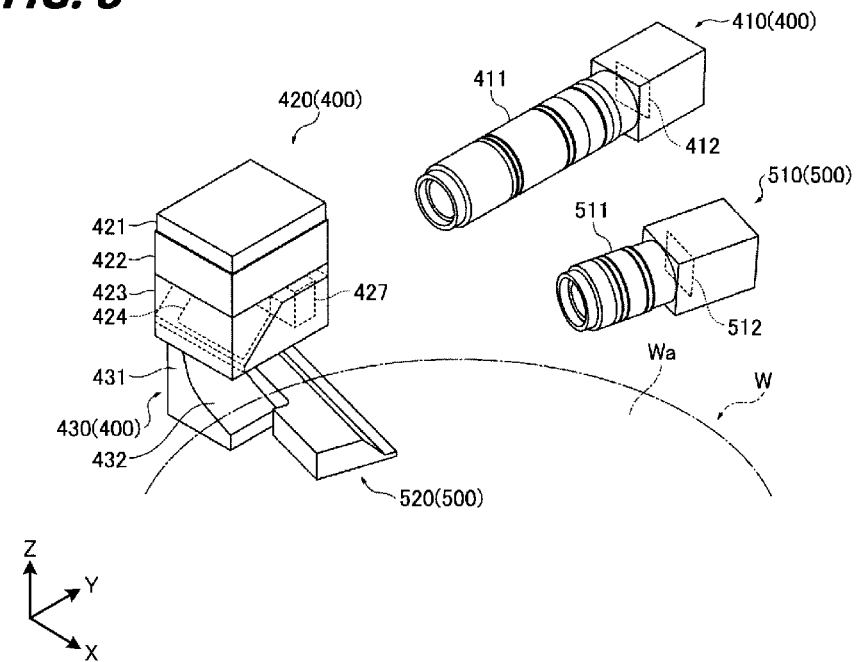
FIG. 8 is a schematic view of first and second image capturing subunits when viewed obliquely from above.
Figure 9:
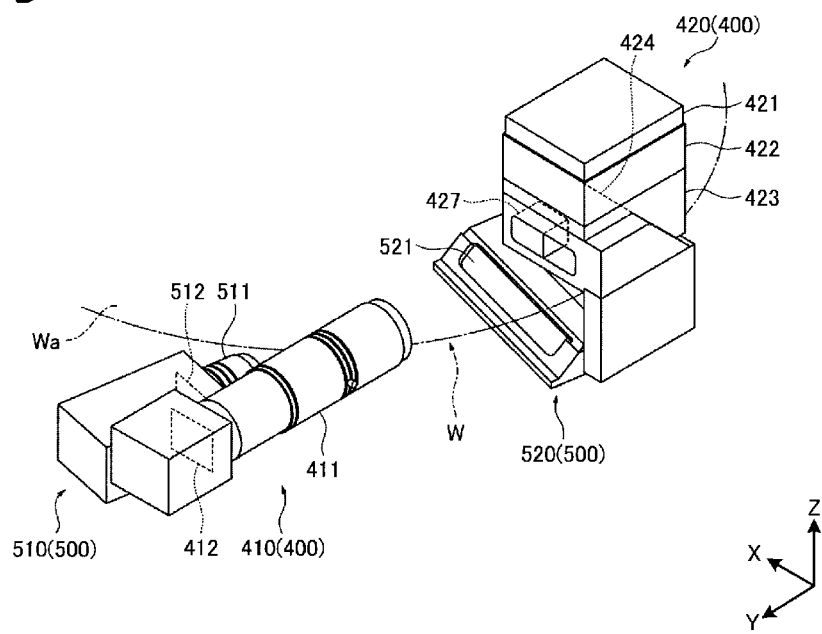
FIG. 9 is a schematic view of the first and second image capturing subunits when viewed obliquely from above.
Figure 10:
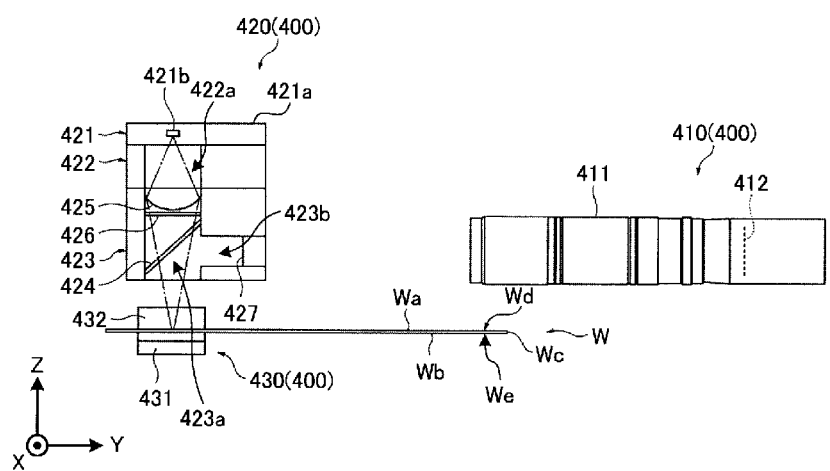
FIG. 10 is a schematic view of the first image capturing subunit when viewed from the side.
Figure 11:
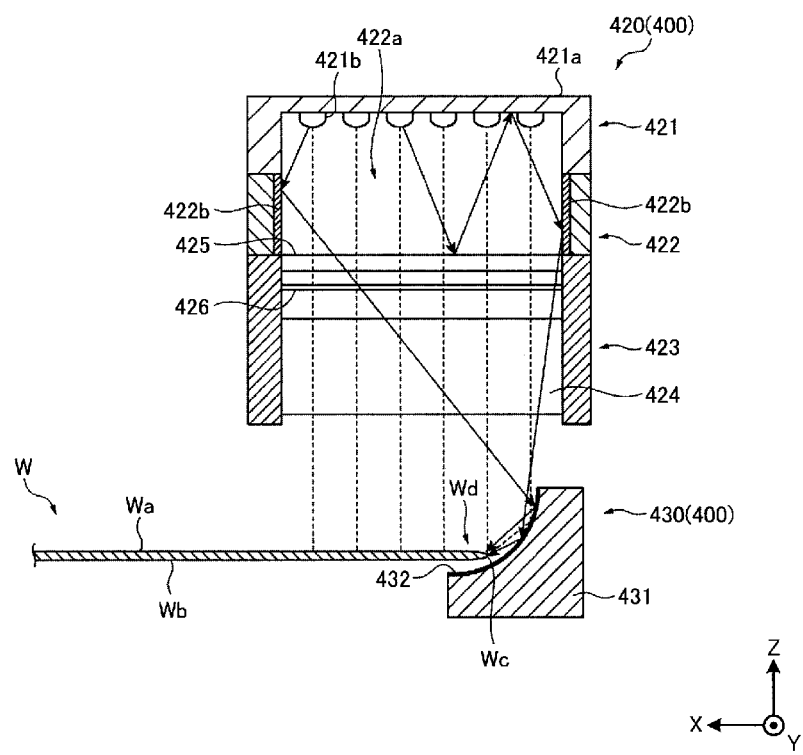
FIG. 11 is a schematic view of a lighting module and a mirror member when viewed from the side.
Figure 12:
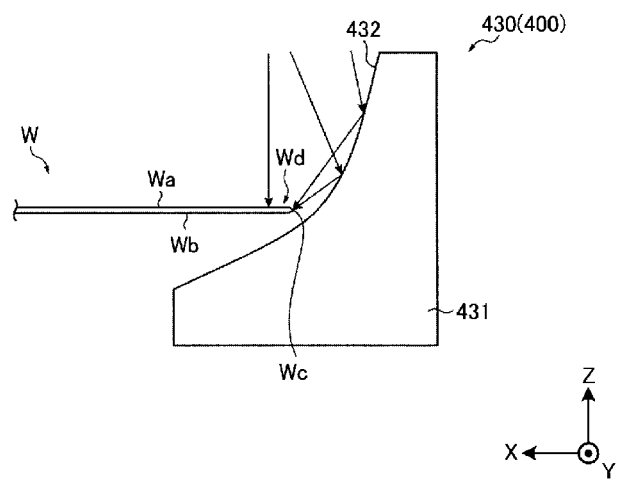
FIG. 12 is a schematic view illustrating a situation where light from the lighting module is reflected on the mirror member.
Figure 13:
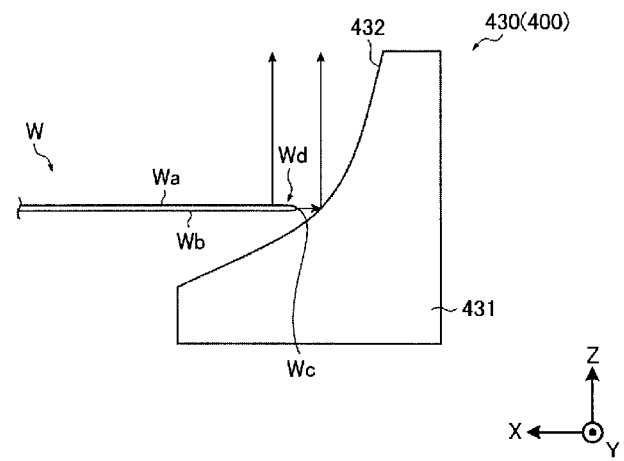
FIG. 13 is a schematic view illustrating a situation where light from a wafer is reflected on the mirror member.

FIGS. 8 and 9 are schematic views of the first and second image capturing subunits 400 and 500 when viewed obliquely from above. FIG. 10 is a schematic view of the first image capturing subunit 400 when viewed from the side, and FIG. 11 is a schematic view of the lighting module 420 and the mirror member 430 when viewed from the side. FIG. 12 is a schematic view illustrating a situation where light from the lighting module 420 is reflected on the mirror member 430, and FIG. 13 is a schematic view illustrating a situation where light from the wafer W is reflected on the mirror member 430.

As illustrated in FIGS. 6 to 10, the first image capturing subunit 400 includes the camera 410 (an example of the one surface side image capturing unit), the lighting module 420, and the mirror member 430.

The camera 410 includes a lens 411 and an image capturing element 412. The optical axis of the camera 410 extends horizontally toward the lighting module 420.

As illustrated in FIGS. 8 to 11, the lighting module 420 is disposed above the wafer W held on the holding table 201. The lighting module 420 includes a light source 421, a light scattering member 422, and a holding member 423.

As illustrated in FIG. 11, the light source 421 includes, for example, a housing 421*a* and a plurality of LED point light sources 421*b* arranged in the housing 421*a*. The plurality of LED point light sources 421*b* are arranged in a row along the radial direction of the wafer W.

As illustrated in FIGS. 9 to 11, the light scattering member 422 is connected to the light source 421 so as to overlap with the light source 421. In the light scattering member 422, a through hole 422*a* is formed to extend in the direction in which the light source 421 and the light scattering member 422 overlap with each other. The inner wall surface of the through hole 422*a* is processed with a mirror surface processing. As a result, when light from the light source 421 is incident into the through hole 422*a* of the light scattering member 422, the incident light irregularly reflects on the mirror surface portion 422*b* in the through hole 422*a* so that scattered light is generated.

The holding member 423 is connected to the light scattering member 422 so as to overlap with the light scattering member 422. In the holding member 423, a through hole 423*a* and a crossing hole 423*b* that crosses the through hole 423*a* are formed. The through hole 423*a* extends in the direction in which the light scattering member 422 and the holding member 423 overlap with each other. The crossing hole 423*b* communicates with the through hole 423*a*.

The holding member 423 holds a half mirror 424, a cylindrical lens 425, a light diffusing member 426, and a focusing lens 427 therein. As illustrated in FIG. 10, the half mirror 424 is disposed at the crossing portion of the through hole 423*a* and the crossing hole 423*b*, for example, in a state of being inclined at an angle of 45° with respect to the horizontal direction. The half mirror 424 has a rectangular shape.

The cylindrical lens 425 is disposed between the light scattering member 422 and the half mirror 424. The cylindrical lens 425 is a convex cylindrical lens that protrudes toward the half mirror 424. The axis of the cylindrical lens 425 extends in the direction in which the plurality of LED point light sources 421*b* is arranged in a row. When the scattered light from the light scattering member 422 is incident on the cylindrical lens 425, the scattered light is expanded along the circumferential direction of the cylindrical surface of the cylindrical lens 425.

The light diffusing member 426 is disposed between the cylindrical lens 425 and the half mirror 424. The light diffusion member 426 is, for example, a sheet member having a rectangular shape, and diffuses the light transmitted through the cylindrical lens 425. Accordingly, diffused light is generated in the light diffusing member 426. For example, the light diffusing member 426 may have an isotropic diffusion function to diffuse the incident light in all directions of the surface of the light diffusing member 426, or may have an anisotropic diffusion function to diffuse the incident light toward the axial direction of the cylindrical lens 425 (the direction orthogonal to the circumferential direction of the cylindrical surface of the cylindrical lens 425).

The focusing lens 427 is disposed inside the crossing hole 423b. The focusing lens 427 has a function of changing the composite focal distance from the lens 411.

As illustrated in FIGS. 10 to 13, the mirror member 430 is disposed below the lighting module 420, and reflects light reflected from the end surface We of the wafer W.

The mirror member 430 includes a main body 431 and a reflecting surface 432. The main body 431 is formed of, for example, an aluminum block.

The reflecting surface 432 is opposite to the end surface Wc of the wafer W held on the holding table 201 and the peripheral edge region We of the lower surface Wb of the wafer W. The reflecting surface 432 is inclined with respect to the rotation axis of the holding table 201.

The reflecting surface 432 is a curved surface that is recessed toward the side which is separated away from the end surface Wc of the wafer W held on the holding table 201. Thus, when the end surface Wc of the wafer W appears on the reflecting surface 432, its mirror image is enlarged as compared with the real image. The curvature radius of the reflecting surface 432 is, for example, 10 mm or more and 30 mm or less. In addition, the opening angle of the reflecting surface 432 (the angle formed by two planes externally touching the reflecting surface 432) is, for example, 100° or more and 150° or less.

In the lighting module 420, the light emitted from the light source 421 is scattered by the light scattering member 422, expanded by the cylindrical lens 425, diffused by the light diffusing member 426, and then, passes through the entire half mirror 424 to be irradiated downward. The diffused light that has passed through the half mirror 424 is reflected on the reflecting surface 432 of the mirror member 430 disposed below the half mirror 424. As illustrated in FIG. 12, when the diffused light is reflected on the reflecting surface 432, the reflected light is mainly irradiated to the end surface Wc of the wafer W and the peripheral edge region Wd on the side of the upper surface Wa of the wafer W.

As illustrated in FIG. 13, the light reflected on the peripheral edge region Wd of the upper surface Wa of the wafer W is not directed toward the reflecting surface 432 of the mirror member 430 but is reflected again on the half mirror 424. The reflected light passes through the lens 411 of the camera 410 without passing through the focusing lens 427 and is incident on the image capturing element 412 of the camera 410.

Meanwhile, the light reflected from the end surface Wc of the wafer W is reflected on the reflecting surface 432 of the mirror member 430 and the half mirror 424 in this order, passes through the focusing lens 427 and the lens 411 of the camera 410 in this order, and is incident on the image capturing element 412 of the camera 410.

In this way, both the light reflected from the peripheral edge region Wd of the upper surface Wa of the wafer W and the light reflected from the end surface Wc of the wafer W and the mirror member 430 are input to the image capturing element 412 of the camera 410. Thus, according to the first image capturing subunit 400, it is possible to capture an image of both the peripheral edge region Wd of the upper surface Wa of the wafer W (the region including the upper surface peripheral edge portion) and the end surface Wc of the wafer W at the same time.

Figure 14:
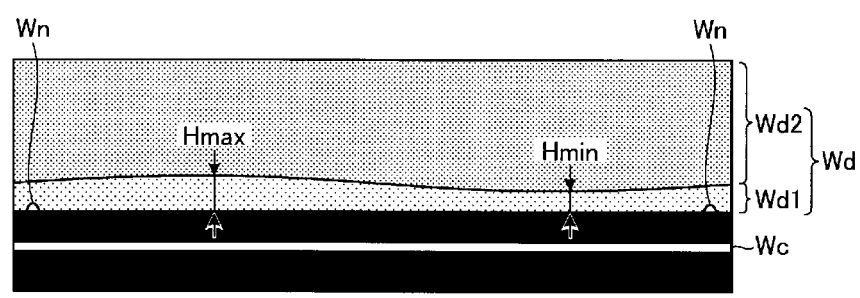
FIG. 14 is a schematic view illustrating an example of an image captured by the first image capturing subunit.

FIG. 14 is a schematic view illustrating an example of an image captured by the first image capturing subunit 400. As illustrated in FIG. 14, the image captured by the first image capturing subunit 400 includes an image of the peripheral edge region Wd of the upper surface Wa of the wafer W when viewed from above and an image of the end surface Wc of the wafer W when viewed from the side.

The images of the peripheral edge region Wd of the upper surface Wa of the wafer W and the end surface Wc of the wafer W are captured in the range of 360° or more based on the position of the notch Wn formed in the wafer W. Accordingly, as illustrated in FIG. 14, the same notch Wn appears at two places in the captured image (both ends of the captured image).

In addition, as described above, the focusing lens 427 is provided in the path where the light reflected on the reflecting surface 432 of the mirror member 430 reaches the lens 411. Thus, even though there is a difference between the optical path length of the light reaching the image capturing element 412 of the camera 410 from the end surface Wc of the wafer W and the optical path length of the light reaching the image capturing element 412 of the camera 410 from the peripheral edge region Wd of the upper surface Wa of the wafer W, the image formation position of the peripheral edge region Wd of the upper surface Wa of the wafer W and the image formation position of the end surface Wc of the wafer W may be adjusted together to the image capturing element 412. Thus, the images of the peripheral edge region Wd of the upper surface Wa of the wafer W and the end surface Wc of the wafer W may be clearly captured together. In addition, the focusing lens 427 is not disposed on the optical path of the light reaching the image capturing element 412 of the camera 410 from the peripheral edge region Wd of the upper surface Wa of the wafer W.

Figure 15:
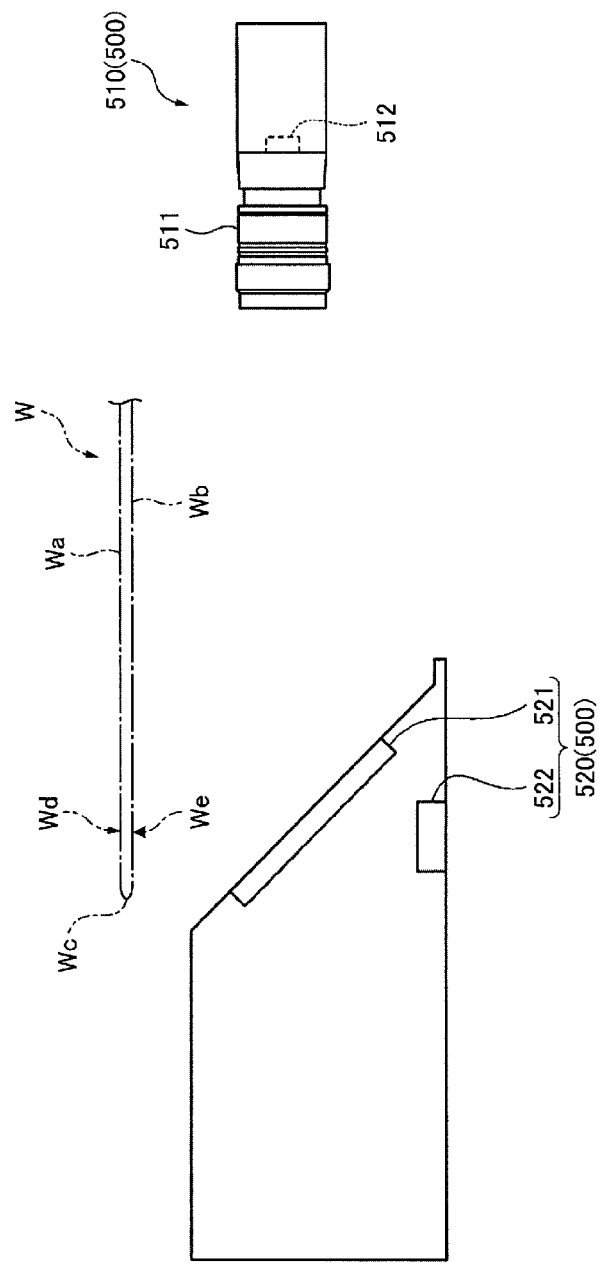
FIG. 15 is a schematic view of the second image capturing subunit when viewed from the side.

Subsequently, the configuration of the second image capturing subunit 500 will be described with reference to FIG. 15. FIG. 15 is a schematic view of the second image capturing subunit 500 when viewed from the side. As illustrated in FIG. 15, the second image capturing subunit 500 includes a camera 510 (an example of the opposite surface side image capturing unit) and a lighting module 520.

The camera 510 includes a lens 511 and an image capturing element 512. The optical axis of the camera 510 extends horizontally toward the lighting module 520.

The lighting module 520 is disposed below the lighting module 420 and below the wafer W held on the holding table 201. The lighting module 520 includes a half mirror 521 and a light source 522. The half mirror 521 is disposed, for example, in a state of being inclined at an angle of 45° with respect to the horizontal direction. The half mirror 521 has, for example, a rectangular shape.

As for the light source 522, light emitted from the light source 522 disposed below the half mirror 521 passes through the entire half mirror 521 and is irradiated upward. The light that has passed through the half mirror 521 passes through the lens 511 of the camera 510 and is incident on the image capturing element 512 of the camera 510. That is, the camera 510 may capture an image of the lower surface Wb of the wafer W which is present in the irradiation region of the light source 522, via the half mirror 521.

In addition, the camera 410 of the first image capturing subunit 400 captures an image in a range of, for example, 12 mm width along the radial direction of the wafer W from the outer peripheral edge of the wafer W, whereas the camera 510 of the second image capturing subunit 500 captures an image in a range of 50 mm width along the radial direction of the wafer W from the outer peripheral edge of the wafer W. Thus, in addition to the state of the region processed by the peripheral edge portion processing unit 18, the state of the region processed by the lower surface processing unit 19 may also be confirmed by using the image captured by the camera 510.

<Configuration of Control Device>

Figure 16:
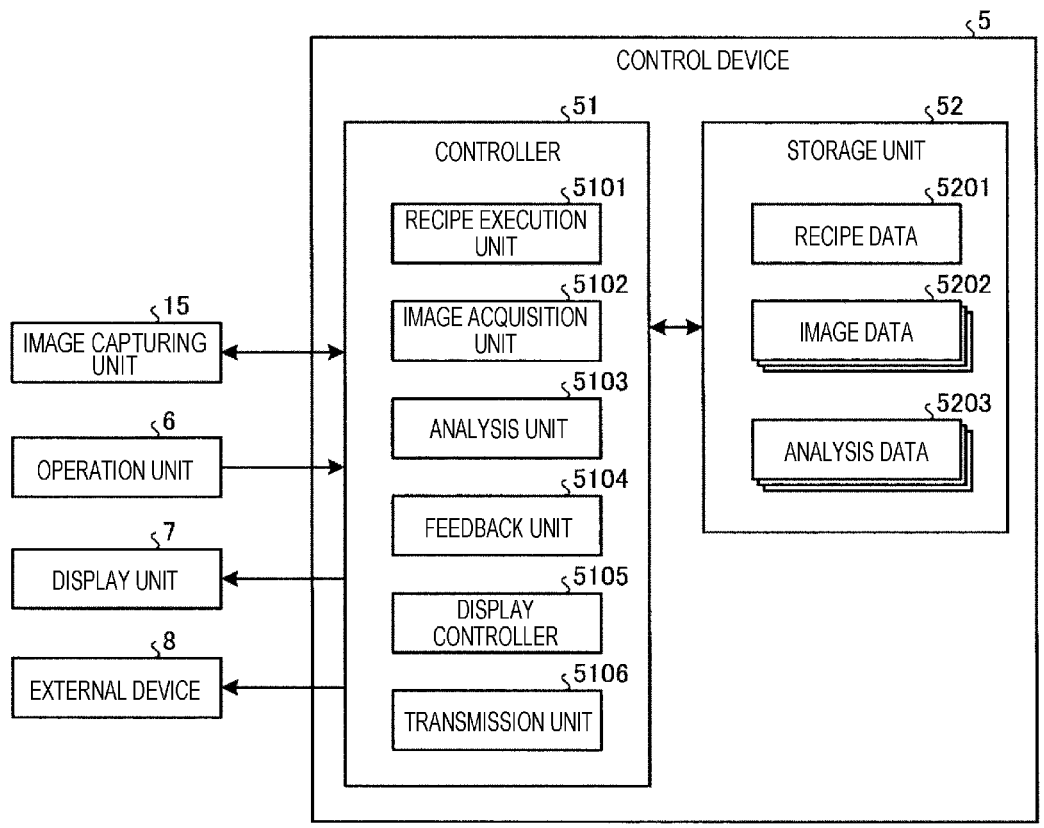
FIG. 16 is a block diagram illustrating an example of a configuration of a control device.

Next, the configuration of the control device 5 will be described with reference to FIG. 16. FIG. 16 is a block diagram illustrating an example of the configuration of the control device 5.

As illustrated in FIG. 16, the controller 51 of the control device 5 includes, for example, a microcomputer including, for example, a CPU, a read only memory (ROM), a random access memory (RAM), and an input/output port, or various circuits. The controller 51 includes a plurality of processing units that function when the CPU executes programs stored in the ROM by using the RAM as a work area. Specifically, the controller 51 includes a recipe execution unit 5101, an image acquisition unit 5102, an analysis unit 5103, a feedback unit 5104, a display controller 5105, and a transmission unit 5106. In addition, some or all of the recipe executing unit 5101, the image acquisition unit 5102, the analysis unit 5103, the feedback unit 5104, the display controller 5105, and the transmission unit 5106 may be configured by hardware such as, for example, an application specific integrated circuit (ASIC) or a field programmable gate array (FPGA).

The storage unit 52 of the control device 5 is implemented by, for example, a semiconductor memory element such as a RAM or a flash memory, or a storage device such as a hard disk or an optical disk. The storage unit 52 stores recipe data 5201, image data 5202, and analysis data 5203.

<Recipe Execution Unit>

The recipe execution unit 5101 controls the first and second conveyance devices 13 and 17, the plurality of peripheral edge portion processing units 18, and the plurality of lower surface processing units 19 according to the recipe data 5201, so as to cause the units to perform a series of substrate processings on the wafer W.

Figure 17:
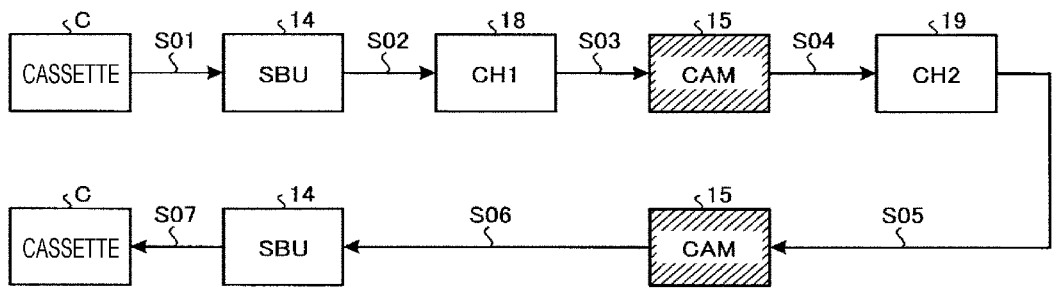
FIG. 17 is a view illustrating the flow of a wafer in the substrate processing system according to the embodiment.

Here, the flow of a series of substrate processings which are performed in the substrate processing system 1 according to the present embodiment will be described with reference to FIG. 17. FIG. 17 is a view illustrating the flow of the wafer W in the substrate processing system 1 according to the present embodiment.

As illustrated in FIG. 17, in the substrate processing system 1 according to the present embodiment, first, the first conveyance device 13 takes out the plurality of wafers W from a cassette C and places the plurality of taken-out wafers W on the substrate placement unit 14 (step S01). Subsequently, the second conveyance device 17 takes out one of the wafers W from the substrate placement unit 14 and conveys the taken-out wafer W to the peripheral edge portion processing unit 18 (step S02).

Subsequently, the peripheral edge portion processing unit 18 performs the peripheral edge portion removal processing on the carried-in wafer W. Specifically, in the peripheral edge portion processing unit 18, first, the holding unit 821 of the substrate holding mechanism 82 holds the wafer W, and the driving unit 823 rotates the holding unit 821 so as to rotate the wafer W held by the holding unit 821. Subsequently, the first and second movement mechanisms 833 and 834 arrange the upper and lower nozzles 831 and 832 at predetermined positions above and below the wafer W, respectively.

Then, the chemical liquid supplied from the chemical liquid supply source 73 is supplied to the upper surface peripheral edge portion and the lower surface peripheral edge portion of the rotating wafer W from the upper and lower nozzles 831 and 832, respectively. As a result, the film is removed from the bevel portion of the wafer W. Then, the peripheral edge portion processing unit 18 performs the rinsing processing and the drying processing, and stops the rotation of the wafer W.

Thereafter, the second conveyance device 17 takes out the wafer W from the peripheral edge portion processing unit 18 and conveys the taken-out wafer W to the image capturing unit 15 (step S03).

Subsequently, the image capturing unit 15 captures an image of the peripheral edge region Wd of the upper surface Wa of the wafer W, the end surface We of the wafer W, and the peripheral edge region We of the lower surface Wb of the wafer W.

Figure 18:
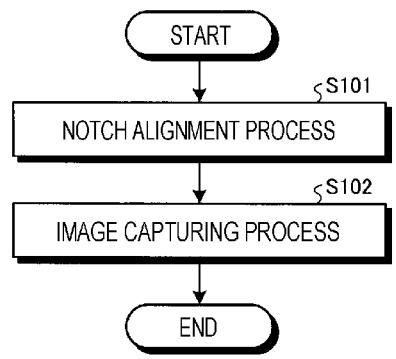
FIG. 18 is a flowchart illustrating the flow of a series of processes performed in the image capturing unit.

Here, a series of processes which are performed in the image capturing unit 15 will be described with reference to FIG. 18. FIG. 18 is a flowchart illustrating the flow of the series of processes which are performed in the image capturing unit 15.

As illustrated in FIG. 18, in the image capturing unit 15, first, a notch alignment process is performed (step S101). The notch alignment process is a process of aligning the position of the notch Wn of the wafer W to a predetermined position.

Specifically, first, the rotation holding subunit 200 adsorbs and holds the wafer W using the holding table 201, and rotates the holding table 201 using the actuator 202 so as to rotate the wafer W adsorbed and held on the holding table 201. Subsequently, the notch detection subunit 300 receives the irradiation light from the light emitting element 320 by the light receiving element 330 so as to detect the notch Wn formed on the wafer W. Then, the rotation holding subunit 200 rotates the wafer W by a predetermined angle using the actuator 202, so as to align the position of the detected notch Wn to a predetermined position. In this way, the rotational position of the wafer W is adjusted.

As described above, the rotation holding subunit 200 that adsorbs, holds, and rotates the wafer W and the notch detection subunit 300 that detects the notch Wn formed in the wafer W are an example of an adjustment mechanism that adjusts the rotational position of the wafer W with respect to the image capturing range of the image capturing unit 15. The image capturing unit 15 detects the notch Wn using the notch detection subunit 300 while adsorbing, holding, and rotating the wafer W using the rotation holding subunit 200, and adjusts the rotational position of the wafer W based on the result of the detection of the notch Wn. In addition, the notch formed in the wafer W is not limited to the notch Wn, and may be, for example, an orientation flat (so-called OF).

In addition, here, the image capturing unit 15 includes the rotation holding subunit 200 and the notch detection subunit 300 as an example of the adjustment mechanism. However, the configuration of the adjustment mechanism is not limited to the example described above. For example, when the rotational position of the wafer W is well-known, the image capturing unit 15 may include the rotation holding subunit 200 and an encoder that detects the rotational position of the holding table 201, as the adjustment mechanism. In this case, by adsorbing and holding the wafer W using the rotation holding subunit 200, and then, rotating the holding table 201 by a predetermined angle, the image capturing unit 15 may adjust the rotational position of the wafer W so that the image capturing process is started at a specific position in the circumferential direction of the wafer W.

Subsequently, in the image capturing unit 15, the image capturing process is performed (step S102). The image capturing process is a process of capturing an image of the peripheral edge region Wd of the upper surface Wa of the wafer W, the end surface We of the wafer W, and the peripheral edge region We of the lower surface Wb of the wafer W.

Figure 19:
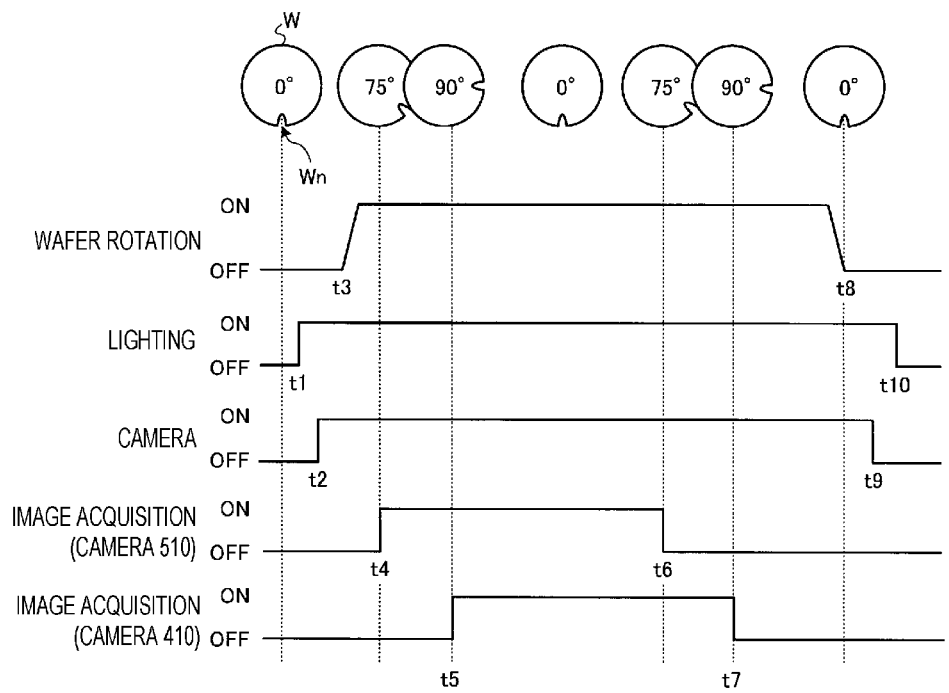
FIG. 19 is a timing chart illustrating the flow of an image capturing process.

Here, the flow of the image capturing process will be described with reference to FIG. 19. FIG. 19 is a timing chart illustrating the flow of the image capturing process. Here, the rotational position of the wafer W at the time of starting the image capturing process is defined as 0°.

As illustrated in FIG. 19, when the image capturing process is started, first, the light sources 421 and 522 of the lighting modules 420 and 520 are turned on (see t1 in FIG. 19). Subsequently, the cameras 410 and 510 are turned on, and the image capturing is started (see, e.g., t2 in FIG. 19).

Subsequently, the actuator 202 of the rotation holding subunit 200 rotates the holding table 201, so as to start the rotation of the wafer W held on the holding table 201 (see, e.g., t3 in FIG. 19). At this time, the rotational speed of the wafer W is lower than the rotational speed of the wafer W during the notch alignment process.

Subsequently, acquiring image data of the image captured by the camera 510 is started at the timing when the image of the notch Wn of the wafer W is captured by the camera 510 (see, e.g., t4 in FIG. 19). In this example, acquiring the image data is started at the timing when the rotational position of the wafer W becomes 75°. The acquired image data is stored in the storage unit 52 of the control device 5.

Subsequently, acquiring image data of the image captured by the camera 410 is started at the timing when the image of the notch Wn of the wafer W is captured by the camera 410, specifically, at the timing when the rotational position of the wafer W becomes 90° (see, e.g., t5 in FIG. 19). The acquired image data is stored in the storage unit 52 of the control device 5.

In the image capturing unit 15 according to the present embodiment, since the installation place of the half mirror 521 is restricted by the existence of the mirror member 430, it is difficult to capture an image of the peripheral edge regions Wd and We at the same rotational position of the wafer W with the cameras 410 and 510 at the same time. Accordingly, in order to match the image capturing ranges of the cameras 410 and 510 each other, the timings for acquiring the image data of the cameras 410 and 510 are deviated from each other (see, e.g., t4 and t5 in FIG. 19). However, when the image of the same rotational position can be captured by the cameras 410 and 510, the timings for acquiring the image data of the cameras 410 and 510 need not to necessarily be deviated from each other.

Subsequently, the acquisition of the image data of the camera 510 is completed at the timing when the rotational position of the wafer W becomes 75° again (see, e.g., t6 in FIG. 19). Similarly, the acquisition of the image data of the camera 410 is completed at the timing when the rotational position of the wafer W becomes 90° again (see, e.g., t7 in FIG. 19). As a result, the image data of the peripheral edge regions Wd and We and the end surface We over the entire circumference of the wafer W are obtained.

Subsequently, the rotation of the wafer W is stopped at the timing when the rotational position of the wafer W becomes 0° (see, e.g., t8 in FIG. 19). Accordingly, the rotational position of the wafer W may be returned to the rotational position at the time of starting the image capturing process, that is, the state where the rotational position of the wafer W is adjusted by the notch alignment process. Then, the cameras 410 and 510 are turned off (see, e.g., t9 in FIG. 19), and the light sources 421 and 522 of the lighting modules 420 and 520 are turned off (see. e.g., t10 in FIG. 19), so that the image capturing process is ended.

As described above, the image capturing unit 15 adjusts the rotational position of the wafer W in the notch alignment process, and then, rotates the wafer W using the rotation holding subunit 200. While rotating the wafer W, the image capturing unit 15 captures the images of the upper surface peripheral edge portion, the end surface, and the lower surface peripheral edge portion of the wafer W over the entire circumference of the wafer W. As a result, it is possible to obtain the image data of the upper surface peripheral edge portion, the end surface, and the lower surface peripheral edge portion of the wafer W over the entire circumference of the wafer W.

When the image capturing process in the image capturing unit 15 is ended, as illustrated in FIG. 17, the second conveyance device 17 takes out the wafer W from the image capturing unit 15 and conveys the taken-out wafer W to the lower surface processing unit 19 (step SS04).

Subsequently, the lower surface processing unit 19 performs the lower surface removal processing on the carried-in wafer W. Specifically, in the lower surface processing unit 19, first, the holding unit 921 of the substrate holding mechanism 92 holds the wafer W, and the driving unit 923 rotates the holding unit 921 so as to rotate the wafer W held by the holding unit 921.

Then, the chemical liquid supplied from the chemical liquid supply source 76 is supplied to the central portion of the lower surface Wb of the rotating wafer W from the supply unit 93. The chemical liquid supplied to the central portion of the lower surface Wb of the wafer W spreads over the entire lower surface Wb with the rotation of the wafer W. As a result, the film is removed from the entire lower surface Wb of the wafer W. Thereafter, the lower surface processing unit 19 performs the rinsing processing and the drying processing and stops the rotation of the wafer W.

When the lower surface processing unit 19 completes the lower surface removal processing, the second conveyance device 17 takes out the wafer W from the lower surface processing unit 19, and conveys the taken-out wafer W to the image capturing unit 15 (step S05). In the image capturing unit 15, the above-described alignment process and image capturing process are performed again. The image data obtained by the image capturing process is stored in the storage unit 52 of the control device 5.

Subsequently, the second conveyance device 17 takes out the wafer W from the image capturing unit 15 and places the taken-out wafer W on the substrate placement unit 14 (step S06). Then, the first conveyance device 13 takes out the wafer W from the substrate placement unit 14, and accommodates the taken-out wafer W in the cassette C (step S07). Accordingly, the series of substrate processings are completed.

<Image Acquisition Unit>

Referring back to FIG. 16, the descriptions of the controller 51 will be continued. The image acquisition unit 5102 acquires the image data from the image capturing unit 15, and stores the image data as image data 5202 in association with, for example, an identification number of the wafer W or image capturing date/time in the storage unit 52.

<Analysis Unit>

The analysis unit 5103 performs an image analysis on the image data 5202 stored in the storage unit 52.

For example, the analysis unit 5103 determines the degree of the removal of the film on the upper surface peripheral edge portion and the end surface We of the wafer W, based on the data of the image captured by the camera 410 among the image data 5202. This determination is performed based on, for example, a difference in color (difference in pixel value) between a region Wd1 to which the chemical liquid is supplied and a region Wd2 to which no chemical liquid is supplied (see, e.g., FIG. 14).

Similarly, the analysis unit 5103 determines the degree of the removal of the film in the peripheral edge region We of the lower surface Wb of the wafer W based on the data of the image captured by the camera 510 among the image data 5202.

Further, the analysis unit 5103 calculates the cut width based on the data of the image captured by the camera 410 among the image data 5202. Specifically, the analysis unit 5103 calculates the cut width of each position in the entire circumference of the wafer W. Then, the analysis unit 5103 calculates an average value of the maximum value Hmax and the minimum value Hmin of the plurality of calculated cut widths, as the cut width (see, e.g., FIG. 14).

In addition, the method of calculating the cut width is not limited to the example above. For example, the analysis unit 5103 may calculate the cut width of each position in the entire circumference of the wafer W, and may calculate an average value of the plurality of calculated cut widths, as the cut width.

Further, the analysis unit 5103 calculates an eccentricity amount of the wafer W based on the data of the image captured by the camera 410 among the image data 5202. The eccentricity amount of the wafer W refers to an amount of a deviation between the center of the wafer W and the rotation center of the substrate holding mechanism 82. For example, when the central position of the wafer W is deviated from the rotation center of the substrate holding mechanism 82, an inconsistency of the cut width occurs in the peripheral edge region Wd of the upper surface Wa of the wafer W. As illustrated in FIG. 14, the inconsistency of the cut width is indicated in a sine wave shape with respect to the circumferential direction of the wafer W. Accordingly, the analysis unit 5103 may calculate the eccentricity amount of the wafer W based on the amplitude of the sine wave.

Further, the analysis unit 5103 detects a defect in the peripheral edge region Wd of the upper surface Wa of the wafer W and the end surface We of the wafer W based on the data of the image captured by the camera 410 among the image data 5202. When there is a defect in the wafer W, the defect portion appears in a different color from that of the surroundings. Thus, the analysis unit 5103 may detect, for example, a region of a pixel where a difference of a pixel value from adjacent pixels is equal to or larger than a threshold value, as the defect portion.

Similarly, the analysis unit 5103 detects a defect in the peripheral edge region We of the lower surface Wb of the wafer W based on the data of the image captured by the camera 510 among the image data 5202.

In addition, the analysis unit 5103 may specify a type of the defect from the shape of the detected defect portion. The type of the defect is, for example, a scratch or chip.

Further, the analysis unit 5103 calculates the warpage amount of the wafer W based on the data of the image captured by the camera 410 among the image data 5202. For example, the analysis unit 5103 may calculate the warpage amount of the wafer W from the shape of the end surface Wc of the wafer W.

The analysis unit 5103 stores the analysis result as the analysis data 5203 in the storage unit 52.

<Feedback Unit>

By changing the recipe data 5201 based on the analysis data 5203 stored in the storage unit 52, the feedback unit 5104 corrects the time for ejecting the chemical liquid from the upper and lower nozzles 831 and 832 to the upper and lower surface peripheral edge portions of the wafer W in the peripheral edge portion processing.

For example, by changing the recipe data 5201 based on the degree of the removal of the film on the upper surface peripheral edge portion and the end surface Wc of the wafer W, the feedback unit 5104 increases the time for ejecting the chemical liquid from the upper and lower nozzles 831 and 832 at the time of the peripheral edge portion removal processing. As a result, the time for ejecting the chemical liquid to the wafer W to be subsequently processed may be optimized.

In addition, by changing the recipe data 5201 based on the degree of the removal of the film on the lower surface Wb of the wafer W, the feedback unit 5104 increases the time for ejecting the chemical liquid from the supply unit 93 at the time of the lower surface removal processing. As a result, the time for ejecting the chemical liquid to the wafer W to be subsequently processed may be optimized.

In addition, by changing the recipe data 5201 based on the information of the cut width among the analysis data 5203, the feedback unit 5104 adjusts the positions of the upper and lower nozzles 831 and 832 at the time of the peripheral edge portion removal processing. For example, when the cut width (the average value of the maximum value Hmax and the minimum value Hmin) included in the analysis data 5203 is larger than a predetermined cut width, the positions of the upper and lower nozzles 831 and 832 are corrected such that the chemical liquid ejected from the upper and lower nozzles 831 and 832 is supplied to the relatively outer peripheral side of the wafer W. In other words, by changing the movement amounts of the upper and lower nozzles 831 and 832 with the first and second movement mechanisms 833 and 834, the processing positions of the upper and lower nozzles 831 and 832 in the peripheral edge portion processing are corrected. As a result, the position of the ejection of the chemical liquid to the wafer W to be subsequently processed may be optimized.

Further, by changing the recipe data 5201 based on the information of the cut width in the analysis data 5203, the feedback unit 5104 corrects the horizontal position of the wafer W with respect to the substrate holding mechanism 82 of the peripheral edge portion processing unit 18.

For example, the feedback unit 5104 corrects the position of the wafer W to be adsorbed and held with respect to the substrate holding mechanism 82, such that the difference between the cut width at the rotational position of 0° and the cut width at the rotational position of 180° becomes small, and the difference between the cut width at the rotational position of 90° and the cut width at the rotational position of 270° becomes small. As a result, the operation to place the wafer W on the substrate holding mechanism 82 by the second conveyance device 17 is corrected, and the eccentricity of the wafer W to be subsequently processed is suppressed.

In addition, here, the operation of the second conveyance device 17 is corrected so as to suppress the eccentricity of the wafer W. However, the object to be corrected is not limited to the operation of the second conveyance device 17. For example, when the peripheral edge portion processing unit 18 includes an adjustment mechanism that adjusts the horizontal position of the wafer W, the operation of the adjustment mechanism may be corrected so as to correct the position of the wafer W to be adsorbed and held with respect to the substrate holding mechanism 82.

<Display Controller>

The display controller 5105 extracts the image data 5202 from the storage unit 52 and displays the image data 5202 on the display unit 7 according to, for example, an operation of the operation unit 6 by a user. As a result, the user may confirm the states of the peripheral edge regions Wd and We of the upper and lower surfaces Wa and Wb of the wafer W and the end surface We of the wafer W. Further, the display controller 5105 extracts the analysis data 5203 from the storage unit 52 and displays the analysis data 5203 on the display unit 7 according to, for example, an operation of the operation unit 6 by the user. As a result, the user may confirm the analysis result by the analysis unit 5103.

In addition, the operation unit 6 is, for example, a keyboard or a touch panel, and the display unit 7 is, for example, a liquid crystal display. The operation unit 6 and the display unit 7 may be attached to the substrate processing system 1 or may be installed at a place away from the substrate processing system 1.

<Transmission Unit>

The transmission unit 5106 transmits the image data 5202 and the analysis data 5203 which are stored in the storage unit 52, to an external device 8 via a network such as, for example, a local area network (LAN). In addition, each time the image data 5202 or the analysis data 5203 is stored in the storage unit 52, the transmission unit 5106 may transmit the newly stored image data 5202 or analysis data 5203 to the external device 8. In addition, the transmission unit 5106 may transmit the image data 5202 or the analysis data 5203 which is selected by, for example, an operation of the operation unit 6 by the user, to the external device 8.

As described above, the substrate processing system 1 (an example of the substrate processing apparatus) according to the present embodiment includes the carry in/out station 2, the transfer station 3, the processing station 4, and the image capturing unit 15. The carry in/out station 2 includes the first conveyance device 13 that takes out and conveys the wafer W (an example of the substrate) from a cassette C. The transfer station 3 is disposed adjacent to the carry in/out station 2, and includes the substrate placement unit 14 on which the wafer W conveyed by the first conveyance device 13 is placed. The processing station 4 is disposed adjacent to the transfer station 3, and includes the second conveyance device 17 that takes out and conveys the wafer W from the substrate placement unit 14, and the plurality of peripheral edge portion processing units 18 and the lower surface processing unit 19 (an example of the processing units) that process the wafer W conveyed by the second conveyance device 17. The image capturing unit 15 is disposed in the transfer station 3, and captures the images of the peripheral edge portion of one of the upper and lower surfaces Wa and Wb of the wafer W and the end surface We of the wafer W.

In addition, the substrate processing system 1 (an example of the substrate processing apparatus) according to the present embodiment includes the cassette placement section 11, the peripheral edge portion processing units 18 (an example of the processing units), the conveyance section 12, the transfer station 3, and the conveyance section 16 (an example of conveyance regions), and the image capturing unit. In the cassette placement section 11, the cassettes C each accommodating a plurality of wafers W (an example of the substrates) are placed. Each peripheral edge portion processing unit 18 cleans or etches the peripheral edge portion of the wafer W taken out from a cassette C. The conveyance section 12, the transfer station 3, and the conveyance section 16 are provided between the cassette placement section 11 and the peripheral edge portion processing unit 18, and the wafer W is conveyed therebetween. The image capturing unit 15 is provided in the transfer station 3, and captures the images of the peripheral edge portion of one of the upper and lower surfaces Wa and Wb of the wafer W processed by the peripheral edge portion processing unit 18 and the end surface We of the same wafer W.

Thus, according to the substrate processing system 1 of the present embodiment, the state of the peripheral edge portion of the wafer W may be confirmed while suppressing the increase in size of the apparatus.

<Modifications>

In the embodiment described above, the image capturing process by the image capturing unit 15 is performed at each of the timing after the peripheral edge portion removal processing by the peripheral edge portion processing unit 18 and the timing after the lower surface removal processing by the lower surface processing unit 19. However, the timing for performing the image capturing process is not limited to the example described above.

Figure 20:
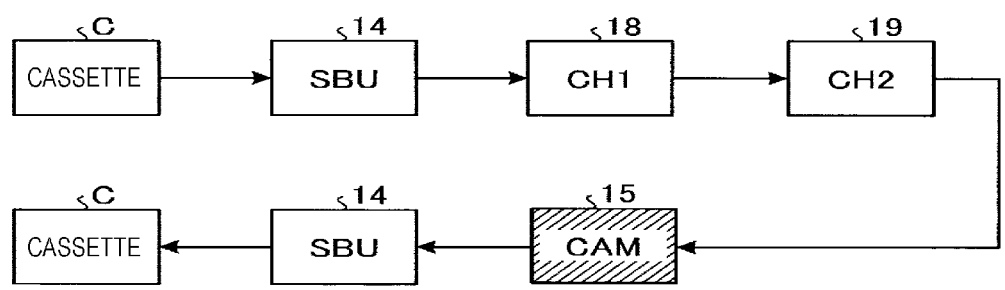
FIG. 20 is a view illustrating the flow of a wafer in a substrate processing system according to a first modification.
Figure 21:
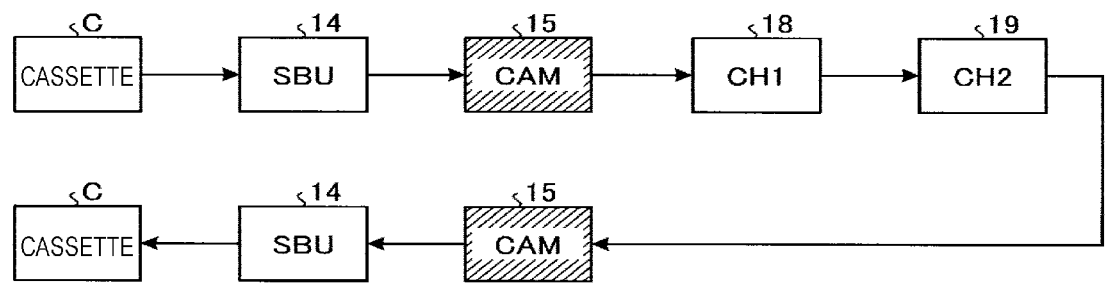
FIG. 21 is a view illustrating the flow of a wafer in a substrate processing system according to a second modification.
Figure 22:
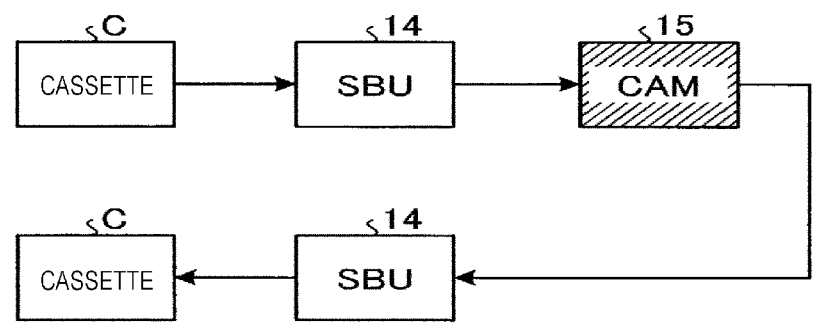
FIG. 22 is a view illustrating the flow of a wafer in a substrate processing system according to a third modification.

Hereinafter, modifications of the timing for performing the image capturing process will be described with reference to FIGS. 20 to 22. FIG. 20 is a view illustrating a flow of the wafer W in a substrate processing system 1 according to a first modification. FIG. 21 is a view illustrating a flow of the wafer W in a substrate processing system 1 according to a second modification. FIG. 22 is a view illustrating a flow of the wafer W in a substrate processing system 1 according to a third modification.

In the following descriptions, the components which are the same as those described above will be denoted by the same reference numerals as used for the components described above, and overlapping descriptions thereof will be omitted.

For example, as illustrated in FIG. 20, the substrate processing system 1 may perform the image capturing process after the lower surface removal processing by the lower surface processing unit 19 is completed, without performing the image capturing process after the peripheral edge portion removal processing. As a result, it is possible to confirm the state of the wafer W after the peripheral edge portion removal processing and the lower surface removal processing, by the image capturing process performed once.

In addition, as illustrated in FIG. 21, the substrate processing system 1 may perform the image capturing process by the image capturing unit 15 prior to the peripheral edge portion removal processing by the peripheral edge portion processing unit 18, as well as after the lower surface removal processing by the lower surface processing unit 19.

In this case, the analysis unit 5103 may more accurately detect a defect of the wafer W based on a difference between the image data 5202 prior to the peripheral edge portion removal processing and the image data 5202 after the same processing. For example, when a defect is detected based on the image data 5202 after the lower surface removal processing, the analysis unit 5103 compares the detected defect portion with the portion which is the same as the detected portion, in the image data 5202 prior to the peripheral edge portion removal processing. Then, when there is no change between the portions, the analysis unit 5103 detects the corresponding portion as a defect portion.

In addition, as illustrated in FIG. 22, the substrate processing system 1 may perform only the image capturing process without performing the peripheral edge portion removal processing by the peripheral edge portion processing unit 18 and the lower surface removal processing by the lower surface processing unit 19. That is, in the substrate processing system 1, the wafer W of which peripheral edge portion or lower surface has been processed in another apparatus may be carried into the image capturing unit 15, subjected to the image capturing process, and then, returned to the cassette C.

In the embodiment described above, the images of the peripheral edge region Wd of the upper surface Wa of the wafer W and the end surface Wc of the wafer W are captured using the first image capturing subunit 400, and the image of the peripheral edge region We of the lower surface Wb of the wafer W is captured using the second image capturing subunit 500. However, the present disclosure is not limited thereto. The first and second image capturing subunits 400 and 500 may be inverted upside down so that the images of the peripheral edge region We of the lower surface Wb of the wafer W and the end surface Wc of the wafer W are captured using the first image capturing subunit 400, and the image of the peripheral edge region Wd of the upper surface Wa of the wafer W is captured using the second image capturing subunit 500.

In the embodiment described above, the image capturing unit 15 is disposed in the transfer station 3. However, the image capturing unit 15 may be disposed in a conveyance region other than the transfer station 3, for example, in the conveyance section 12 or 16.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
   a carry in/out station including a first conveyor that takes out and conveys a substrate from a cassette;
   a transfer station disposed adjacent to the carry in/out station, and including a substrate holder on which the substrate conveyed by the first conveyor is placed;
   a processing station disposed adjacent to the transfer station, and including a second conveyor that takes out and conveys the substrate from the substrate holder and a plurality of processing chambers that processes the substrate conveyed by the second conveyor; and
   an image capturing unit disposed in the transfer station, and configured to capture an image of a peripheral edge portion of one of upper and lower surfaces of the substrate and an end surface of the substrate,
   wherein the image capturing unit includes:
   a mirror that reflects light reflected from the end surface of the substrate; and
   a one surface side camera that receives each of light reflected from a peripheral edge portion of one surface of the substrate and the light reflected from the mirror, so as to capture an image of the peripheral edge portion of the one surface of the substrate and the end surface of the substrate at the same time.

2. The substrate processing apparatus of claim 1, wherein the image capturing unit is disposed below the substrate holder.

3. The substrate processing apparatus of claim 2, wherein the image capturing unit further includes an opening that opens toward a conveyance section where the second conveyor is accommodated, and
   the second conveyor carries the substrate into or out from the image capturing unit via the opening.

4. The substrate processing apparatus of claim 2, wherein the image capturing unit further includes an opposite surface side camera that captures an image of a peripheral edge portion of an opposite one of the upper and lower surfaces of the substrate.

5. The substrate processing apparatus of claim 2, further comprising:
   an adjuster that adjusts a rotational position of the substrate with respect to an image capturing range of the image capturing unit.

6. The substrate processing apparatus of claim 1, wherein the image capturing unit further includes an opening that opens toward a conveyance section where the second conveyor is accommodated, and
   the second conveyor carries the substrate into or out from the image capturing unit via the opening.

7. The substrate processing apparatus of claim 6, wherein the image capturing unit further includes an opposite surface side camera that captures an image of a peripheral edge portion of an opposite one of the upper and lower surfaces of the substrate.

8. The substrate processing apparatus of claim 6, further comprising:
   an adjuster that adjusts a rotational position of the substrate with respect to an image capturing range of the image capturing unit.

9. The substrate processing apparatus of claim 1, wherein the image capturing unit further includes an opposite surface side camera that captures an image of a peripheral edge portion of an opposite one of the upper and lower surfaces of the substrate.

10. The substrate processing apparatus of claim 9, further comprising:
    an adjuster that adjusts a rotational position of the substrate with respect to an image capturing range of the image capturing unit.

11. The substrate processing apparatus of claim 1, further comprising:
    an adjuster that adjusts a rotational position of the substrate with respect to an image capturing range of the image capturing unit.

12. The substrate processing apparatus of claim 11, wherein the adjuster includes:
    a rotation table that adsorbs, holds, and rotates the substrate; and
    a detector that detects a notch formed in the substrate, and while adsorbing, holding, and rotating the substrate by using the rotation table, the image capturing unit detects the notch by using the detector and adjusts the rotational position of the substrate based on a detection result.

13. The substrate processing apparatus of claim 12, wherein after the adjustment of the rotational position of the substrate, the image capturing unit captures an image of the peripheral edge portion of one surface of the substrate and the end surface of the substrate over the entire circumference of the substrate, while rotating the substrate by using the rotation table.

* * * * *